(12) United States Patent
Tsai et al.

(10) Patent No.: US 10,164,359 B1
(45) Date of Patent: Dec. 25, 2018

(54) POWER CONNECTOR AND ASSEMBLING METHOD THEREOF

(71) Applicant: GIGA-BYTE TECHNOLOGY CO., LTD., New Taipei (TW)

(72) Inventors: Tung-Lin Tsai, New Taipei (TW); Chih-Jen Hou, New Taipei (TW); Chang-Hsiang Chen, New Taipei (TW); Ching-Chuan Huang, New Taipei (TW); Chuang-Pan Tai, New Taipei (TW)

(73) Assignee: GIGA-BYTE TECHNOLOGY CO., LTD., New Taipei (TW)

( * ) Notice: Subject to any disclaimer, the term of this patent is extended or adjusted under 35 U.S.C. 154(b) by 0 days.

(21) Appl. No.: 15/867,528

(22) Filed: Jan. 10, 2018

(30) Foreign Application Priority Data

Sep. 29, 2017 (TW) .............................. 106133778 A

(51) Int. Cl.
| | | |
|---|---|---|
| *H01R 12/70* | (2011.01) | |
| *H02B 1/26* | (2006.01) | |
| *H05K 7/14* | (2006.01) | |
| *H01R 12/72* | (2011.01) | |
| *H01R 13/11* | (2006.01) | |
| *H01R 107/00* | (2006.01) | |

(52) U.S. Cl.
CPC ....... *H01R 12/7088* (2013.01); *H01R 12/724* (2013.01); *H02B 1/26* (2013.01); *H05K 7/1457* (2013.01); *H05K 7/1492* (2013.01); *H01R 13/112* (2013.01); *H01R 2107/00* (2013.01)

(58) Field of Classification Search
CPC .............. H01R 13/502; H01R 13/5025; H01R 13/504; H01R 13/514; H01R 13/5208; H01R 13/5213; H01R 13/5216; H01R 43/24; H01R 12/7088; H01R 12/724
See application file for complete search history.

(56) References Cited

U.S. PATENT DOCUMENTS

| | | | | |
|---|---|---|---|---|
| 3,375,481 A | * | 3/1968 | Parnell ................... | H01R 31/00 439/466 |
| 3,555,493 A | * | 1/1971 | Baumanis ............ | H01R 12/721 439/636 |
| 5,911,595 A | * | 6/1999 | Orr, Jr. ................... | H01R 13/58 439/471 |
| 5,954,533 A | * | 9/1999 | Hatagishi ............... | H01R 43/24 439/397 |
| 6,159,041 A | * | 12/2000 | Davis ................. | H01R 13/5213 439/559 |

* cited by examiner

*Primary Examiner* — Vanessa Girardi
(74) *Attorney, Agent, or Firm* — Maschoff Brennan

(57) ABSTRACT

A power connector includes housing, partition plate, first and second pins, first and second wires and filler. The housing has an interior space, first and second slots. The partition plate divides the interior space into first and second wire channels. Each first and second pin has an inserting portion and a wire connecting portion. The wire connecting portions of the first and second pins are respectively located in the first and second wire channels. The first and the second wires are respectively located in the first and second wire channels. The first and second wires are electrically connected to the wire connecting portions of the first and the second pins respectively. A material of the filler is different from the housing. The filler is filled in the interior space to enclose and separate the first wires and the second wires.

12 Claims, 8 Drawing Sheets

POWER CONNECTOR AND ASSEMBLING METHOD THEREOF

CROSS-REFERENCE TO RELATED APPLICATIONS

This non-provisional application claims priority under 35 U. S. C. § 119(a) on Patent Application No(s). 106133778 filed in Taiwan on Sep. 29, 2017, the entire contents of which are hereby incorporated by reference.

TECHNICAL FIELD

The disclosure relates to a connector and an assembling method thereof, more particularly to a power connector and an assembling method thereof.

BACKGROUND

Generally, in a server or personal computer, electronic devices including power supply, central processing unit and display card require wired connections to connect to one another. In detail, each wired connection has connectors at both ends for connecting two devices.

For example, a power connectors used to connect to the power supply has a casing, the casing has many partitions inside, and a wire can be inserted into a compartment formed between the adjacent partitions to connect to a pin inside the compartment.

SUMMARY

One embodiment of the disclosure provides a power connector including a housing, a partition plate, a plurality of first pins, a plurality of second pins, a plurality of first wires, a plurality of second wires and a filler. The housing has an interior space, a plurality of first insertion slots and a plurality of second insertion slots. The first insertion slots and the second insertion slots are connected to the interior space. The partition plate is located in the interior and divides the interior space into a plurality of first wire channels and a plurality of second wire channels. The first insertion slots and the second insertion slots are respectively perpendicular to the first wire channels and the second wire channels. Each of the first pins and the second pins has an inserting section and a wire contact section. The inserting sections of the first pins and the inserting sections of the second pins are respectively located in the first insertion slots and the second insertion slots. The wire contact sections of the first pins and the wire contact sections of the second pins are respectively located in the first wire channels and the second wire channels. The first wires and the second wires are respectively located in the first wire channels and the second wire channels, and respectively electrically connected to the wire contact sections of the first pins and the wire contact sections of the second pins. The filler is made of a different material from the housing, and the filler is filled in the interior space to enclose and separate the first wires and the second wires.

One embodiment of the disclosure provides an assembling method of a power connector including the following steps. Firstly, the first step is to dispose a plurality of first pins into a plurality of first insertion slots of a housing, respectively. Then, the second step is to dispose a plurality of first wires into a plurality of first wire channels of the housing, and to electrically connect the first wires to the first pins, respectively. The third step is to dispose a partition plate above the first wires. The fourth step is to dispose a plurality of second pins into a plurality of second insertion slots of the housing, respectively. The fifth step is to dispose a plurality of second wires into a plurality of second wire channels of the housing, and to electrically connect the second wires to the second pins, respectively. The final step is to fill filler having a melting point lower than that of the housing into the first wire channels and the second wire channels, and solidify the filler to enclose and separate the first wires and the second wires in the housing.

According to the power connector and the assembling method thereof discussed above, the housing and the separator are made of different materials instead a single unit, the separator is the filler, which is made of a material different from that of the housing, to be filled into the housing for sealing and separating the pins and wires. That is, the filler is not preexisting in the housing but is filled into the housing after the pins and wires are positioned in desired positions. Therefore, there is no limitation while disposing the pins and wires, so the pins and wires have large space to be disposed, enabling convenient assembling.

In addition, because the pins and the wires are fixed by the filler which is made of a different material from the housing, the strength of the power connector is thus improved, thereby reducing the possibility of the pins accidentally touching the wire.

Moreover, because the first insertion slots and the second insertion slots are perpendicular to the first wire channels and the second wire channels, and the inserting direction of the power connector is perpendicular to the extension direction of the wire, the length of the power connector in the inserting direction is short, thus it is beneficial for miniaturizing the computer devices, and the wires can be arranged along the surface of the electronic device so that airflow for heat dissipation is prevented from being blocked by the wires.

BRIEF DESCRIPTION OF THE DRAWINGS

The present disclosure will become more fully understood from the detailed description given here in below and the accompanying drawings which are given by way of illustration only and thus are not intending to limit the present disclosure and wherein.

DETAILED DESCRIPTION

Figure 1:
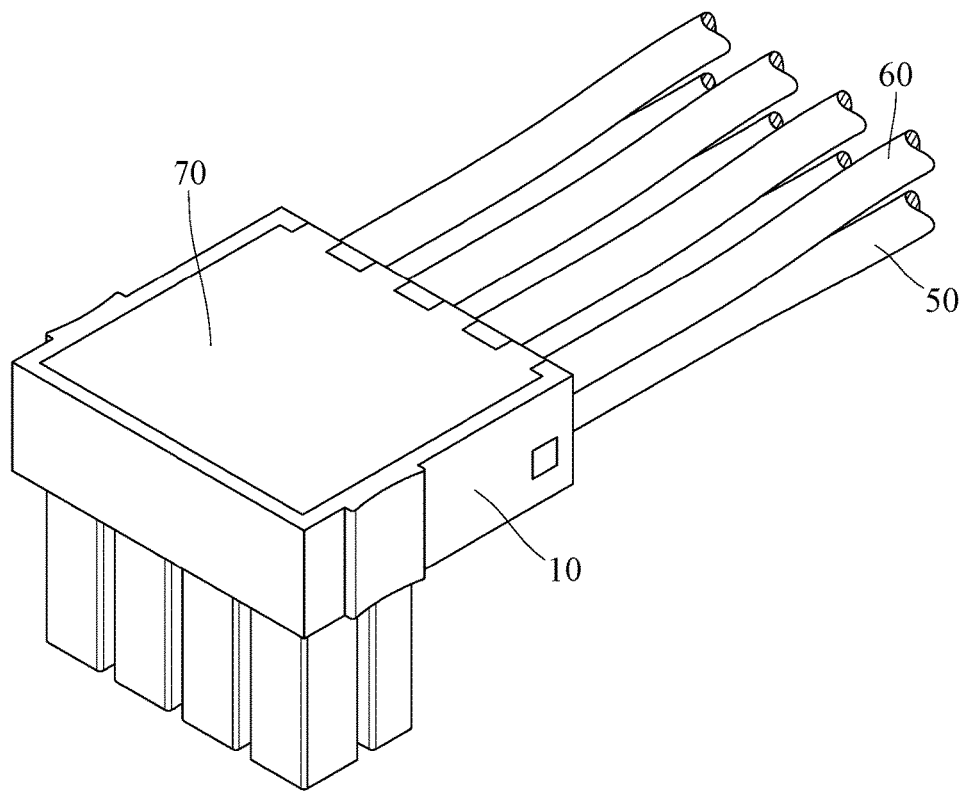
FIG. 1 a perspective view of a power connector in accordance with one embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
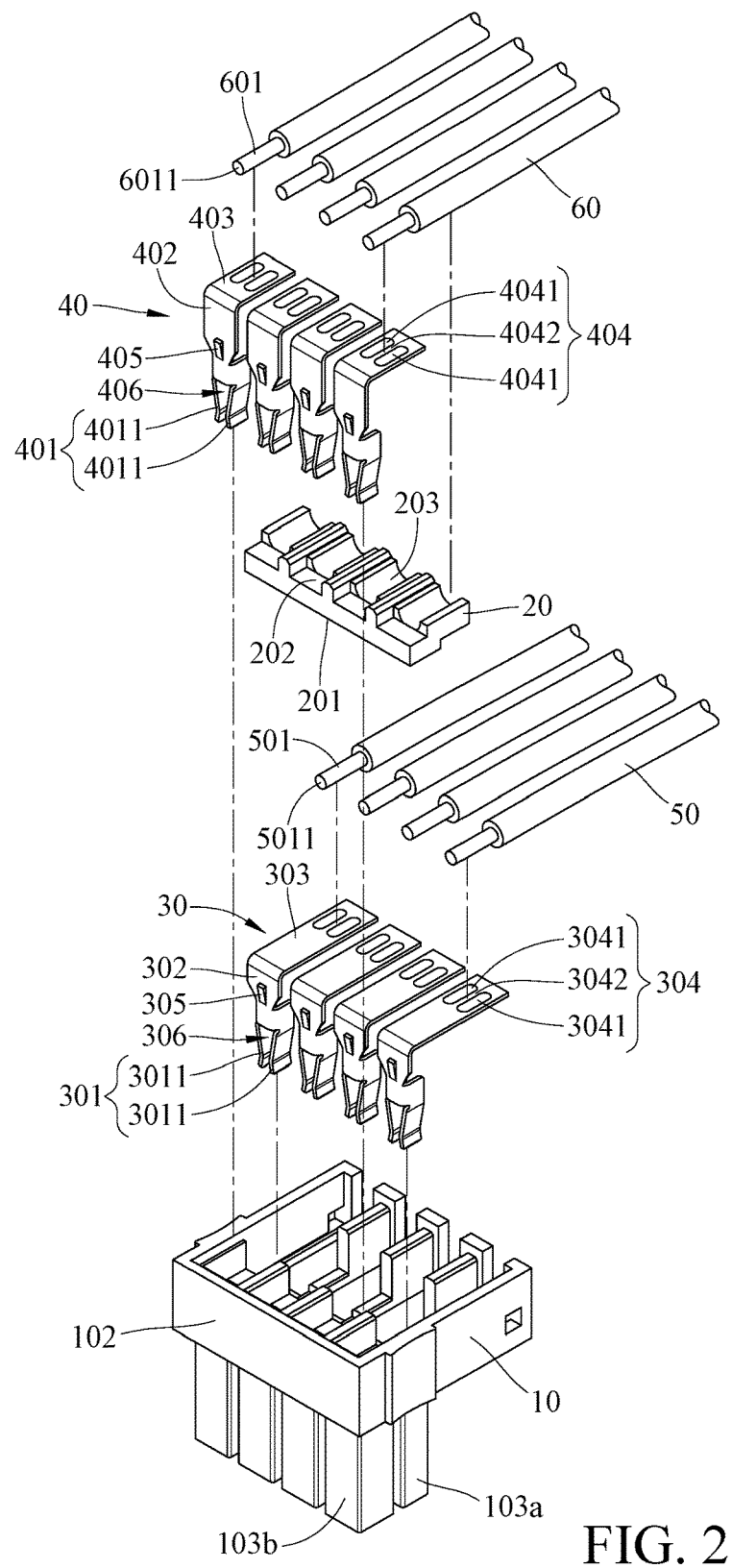
FIG. 2 is an exploded view of the power connector before filling filler.
Figure 3:
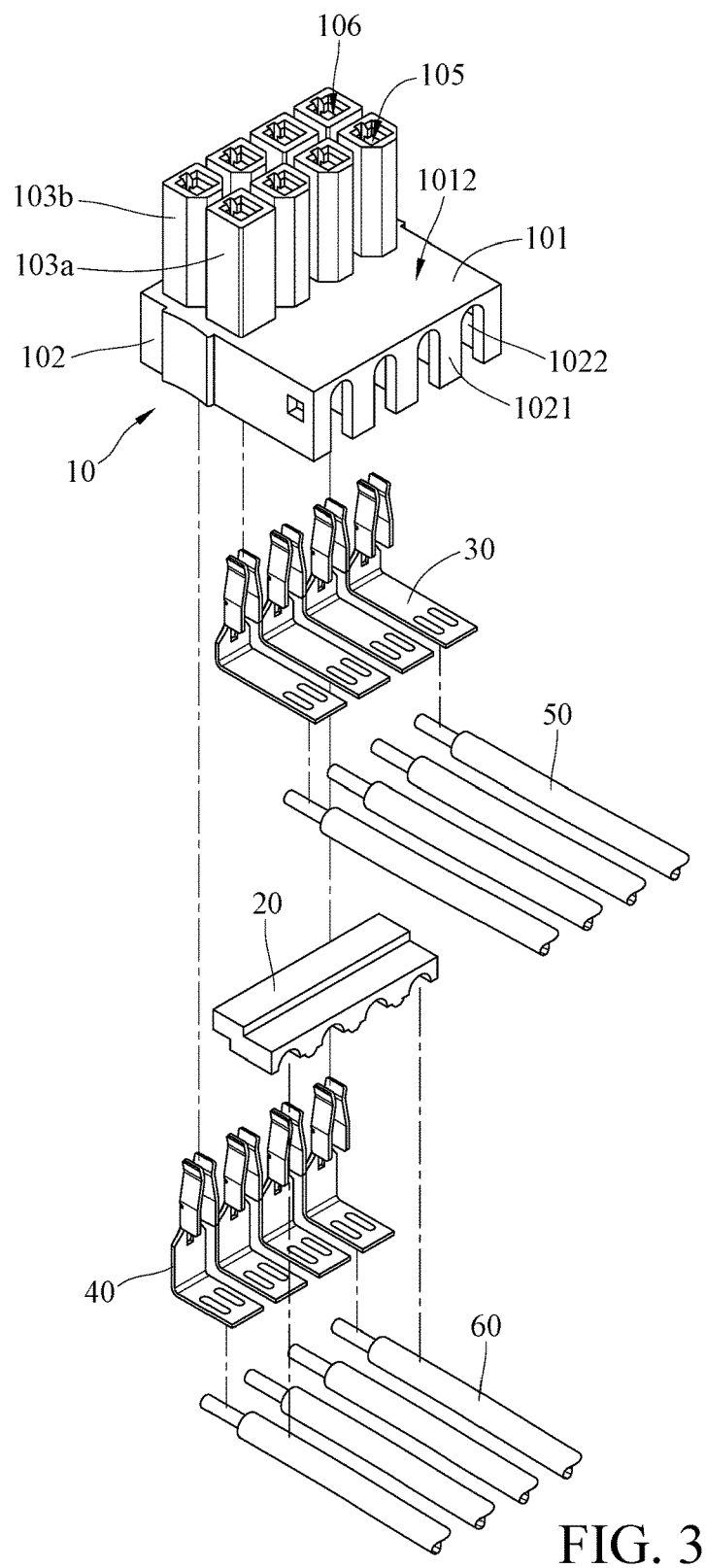
FIG. 3 is another exploded view of the power connector before filling the filler.
Figure 4:
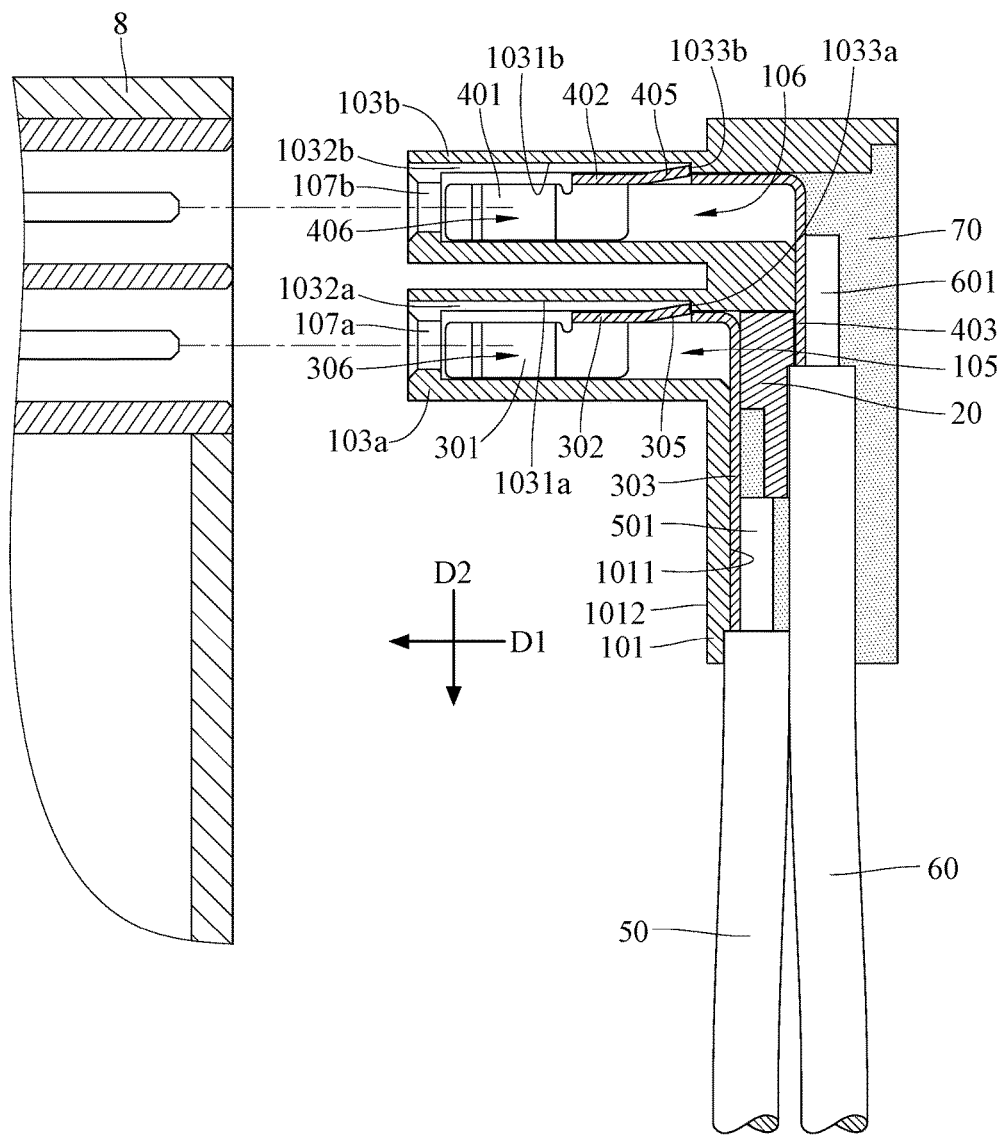
FIG. 4 is a cross-sectional view of the power connector and a corresponding connector.
Figure 5:
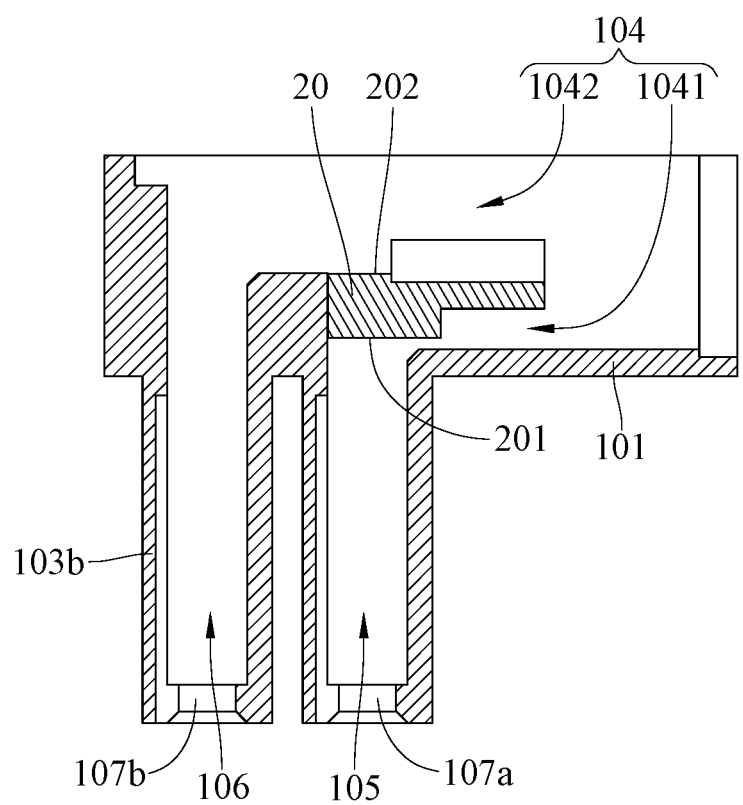
FIG. 5 is a cross-sectional view of a housing of the power connector in FIG. 1.

Please refer to FIG. 1 to FIG. 5. FIG. 1 a perspective view of a power connector in accordance with one embodiment of the disclosure, FIG. 2 is an exploded view of the power connector before filling filler, FIG. 3 is another exploded view of the power connector before filling the filler, FIG. 4 is a cross-sectional view of the power connector and a corresponding connector, and FIG. 5 is a cross-sectional view of a housing of the power connector in FIG. 1.

In this embodiment, a power connector 1a is provided. The power connector 1a includes a housing 10, a partition plate 20, a plurality of first pins 30, a plurality of second pins 40, a plurality of first wires 50, a plurality of second wires 60 and a filler 70.

The housing 10 is, for example, made of liquid crystalline polyester (LCP), nylon or other polymeric materials. The housing 10 includes a bottom portion 101, a surrounding portion 102, a plurality of first protrusions 103a, a plurality of second protrusions 103b, a plurality of first insertion slots 105 and a plurality of second insertion slots 106.

The bottom portion 101 has a top surface 1011 and a bottom surface 1012 opposite to each other.

The surrounding portion 102 protrudes from the top surface 1011 of the bottom portion 101. The surrounding portion 102 and the bottom portion 101s together form an interior space 104. The surrounding portion 102 has a side wall 1021 and a plurality of through holes 1022 located on the side wall 1021.

The first protrusions 103a and the second protrusions 103b protrude from the bottom surface 1012 of the bottom portion 101. The first insertion slots 105 respectively penetrate through the first protrusions 103a, and the second insertion slots 106 respectively penetrate through the second protrusions 103b, and all of them penetrate through the bottom portion 101. Thus, the first insertion slots 105 and the second insertion slots 106 are connected to the interior space 104. Each of the first protrusions 103a has a first opening 107a on an end away from the bottom portion 101, and each of the second protrusions 103b has a second opening 107b on an end away from the bottom portion 101.

Furthermore, each of the first protrusions 103a has an inner surface 1031a forming the first insertion slots 105 and a groove 1032a located on the inner surface 1031a. Similarly, each of the second protrusions 103b has an inner surface 1031b forming the second insertion slots 106 and a groove 1032b located on the inner surface 1031b.

In addition, each of the grooves 1032b has a stop surface 1033b on a side away from the opening 107b and facing the opening 107b, and each of the grooves 1032a has a stop surface 1033a on a side away from the opening 107a and facing the opening 107a. In detail, the normal lines of the stop surfaces 1033a and 1033b respectively pass through the openings 107a and 107b.

The partition plate 20 is made of, for example, the same material as the housing 10, and is located in the interior space 104 so as to divide the interior space 104 into a plurality of first wire channels 1041 and a plurality of second wire channels 1042. The first wire channels 1041 are located closer to the bottom portion 101 than the second wire channels 1042. The first insertion slot 105 is perpendicular to the first wire channel 1041, and the second insertion slot 106 is perpendicular to the second wire channel 1042. That is, when the power connector 1a is inserted to a corresponding connector (e.g. the connector 8 in FIG. 4) along an inserting direction D1, the inserting direction D1 is perpendicular to an extension direction D2 of the wire channels 1041 and 1042.

The partition plate 20 has a first surface 201, a second surface 202 and a plurality of positioning slots 203. The first surface 201 faces the first wire channels 1041. The second surface 202 faces away from the first surface 201. That is, the second surface 202 faces the second wire channels 1042. The positioning slots 203 are located on the second surface 202 for positioning the wires in the second wire channels 1042, but the present disclosure is not limited thereto. In other embodiments, the first surface and the second surface of the partition plate may both have the positioning slots 203 in order to position the wires in the first wire channels and the second wire channels.

Please refer to FIG. 2, FIG. 4 and FIG. 5. Each of the first pins 30 has an inserting section 301, a middle section 302, a wire contact section 303, a positioning structure 304 and an engaging portion 305. In each first pin 30, the middle section 302 is connected between the inserting section 301 and the wire contact section 303 and perpendicular to the wire contact section 303, the positioning structure 304 is located on the wire contact section 303, and the engaging portions 305 is located at a junction between the middle section 302 and the inserting section 301. The inserting sections 301 of the first pins 30 are respectively located in the first insertion slots 105, and the wire contact section 303 of the first pins 30 are respectively located in the first wire channels 1041.

Each of the inserting sections 301 includes two inserting pieces 3011. In each inserting section 301, the inserting pieces 3011 are located opposite to each other and spaced apart by a heat dissipation channel 306. The heat dissipation channels 306 are respectively connected to the grooves 1032a.

Each of the positioning structures 304 includes, for example, two protruding portions 3041 substantially parallel to each other and spaced apart by a positioning space 3042.

Each of the engaging portions 305 is, for example, a protruding block. The engaging portions 305 are respectively located in the grooves 1032a, and respectively press against the stop surfaces 1033a, which makes the first pins 30 stably disposed in the first insertion slots 105 and the first wire channels 1041.

Each of the second pins 40 has an inserting section 401, a middle section 402, a wire contact section 403, a positioning structure 404 and an engaging portion 405. In each second pin 40, the middle section 402 is connected between the inserting sections 401 and the wire contact section 403 and perpendicular to the wire contact section 403, the positioning structure 404 is located on the wire contact sections 403, and the engaging portions 405 is located at junction between the middle sections 402 and the inserting sections 401. The inserting sections 401 of the second pins 40 are respectively located in the second insertion slots 106, and the wire contact section 403 of the second pins 40 are respectively located in the first wire channels 1041, Each of the inserting sections 401 includes two inserting pieces 4011. In each inserting sections 401, the inserting pieces 4011 are located opposite to each other and spaced apart by a heat dissipation channel 406. The heat dissipation channels 406 are respectively connected to the grooves 1032b.

Each of the positioning structures 404 includes, for example, two protruding portions 4041 substantially parallel to each other and spaced apart by a positioning space 4042.

Each of the engaging portions 405 is, for example, a protruding block. The engaging portions 405 are respectively located in the grooves 1032b, and respectively press against the stop surface 1033b, which makes the second pins 40 stably disposed in the second insertion slots 106 and the second wire channels 1042.

As discussed in above, in this embodiment, the heat dissipation channels 306 and 406 are connected to the openings 107a and 107b through the grooves 1032a and 1032b. Thus, heat could be rapidly dissipated.

Moreover, in this embodiment, the first pins 30 and the second pins 40 are made of, for example, high conductivity copper. The high conductivity copper is a copper alloy containing high percentage of copper, thus it has a better electrical conductivity. The high conductivity copper is, for example, the alloy of C1070, OFE (C1010) ETP (C1100), C1100-P, C1201 or C1221.

Each of the first wires 50 has a contact end 501. The first wires 50 are disposed through the through holes 1022 of the surrounding portion 102 so as to respectively position the contact ends 501 in the first wire channels 1041. The contact ends 501 of the first wires 50 are respectively disposed on the positioning spaces 3042 of the first pins 30 by, for example, soldering, to respectively electrically connect the first wires 50 to the first pins 30.

Each of the second wires 60 has a contact end 601. The second wires 60 are disposed through the through holes 1022 of the surrounding portion 102 so as to respectively position the contact ends 601 in the second wire channels 1042. The contact end 601 of the second wires 60 are respectively disposed on the positioning spaces 4042 of the second pins 40 to respectively electrically connect the second wires 60 to the second pins 40.

In this embodiment, a distance between an end surface 5011 of the contact end 501 of the first wire 50 and the side wall 1021 is different from a distance between an end surface 6011 of the contact end 601 of the second wire 60 and the side wall 1021. That is, the contact ends 501 of the first wires 50 and the contact ends 601 of the second wires 60 are not aligned. It is because that the contact ends 501 and the contact ends 601 are used to electrically connect to opposite electrodes, and the not-aligned arrangement can reduce the possibility of short-circuit when the contact end 501 accidentally falls from the first pin 30.

The filler 70 is filled in the first wire channels 1041 and the second wire channels 1042 to enclose and separate the first wires 50 and the second wires 60.

In this embodiment, the filler 70 is made of a different material from the housing 10. A hardness of the housing 10 and a hardness of the partition plate 20 are both larger than a hardness of the filler 70. For example, the filler 70 is, for example, a Polyvinyl Chloride (PVC) or other thermoplastics.

Please refer FIG. 4, in this embodiment, because the pins are bent perpendicularly, the length of the power connector 1a in the inserting direction D1 is approximately equal to the length of the inserting section 301 plus the length of the middle section 302 (or, the length of the inserting section 401 plus the length of the middle section 402). That is, the length of the power connector 1a in the inserting direction D1 is short, thus it is beneficial for miniaturizing the computer devices, and the wires can be arranged along the surface of the electronic device so that airflow for heat dissipation is prevented from being blocked by the wires.

In contrast, in a conventional power connector, its pins are straight and not angled, so its total length along the inserting direction is larger than that of the power connector of the disclosure and is approximately equal to the length of its pins. In addition, because the pin has to be long enough to meet the current requirement, it is impossible to deduct the length of the conventional power connector in the inserting direction by shortening the pins.

In this embodiment, the pins 30, 40 are bended perpendicularly, so they could have sufficient lengths to meet the current requirement. In detail, the wire contact sections 303, 403 are bent with respect to the link sections 302, 402 and the inserting sections 301, 401. Thus, the length of wire contact section 303, 403 is saved in the inserting direction during the power connector 1a is inserted to a corresponding connector.

In addition, because the pins 30 and 40 are made of high conductivity copper, they are able to be loaded with high current with small volume of the power connector 1a. For example, the conventional brass pin only contains 70% copper, but the pins 30 and 40 each contain more copper than the brass pin, so the pins 30 and 40 can be loaded with 2 more amperes higher than the conventional brass pins in the same volume, and the pins 30 and 40 can be shorter than the brass pins in the same current withstand capability. Hence, the pins 30 and 40 are beneficial for miniaturizing the power connector and increasing the current withstand capability of the power connector.

Furthermore, in this embodiment, the positioning structure 304 includes the protruding portions 3041 and the positioning structure 404 includes the protruding portions 4041, and the contact ends 501 and 601 are respectively positioned at the positioning space 3042 between the protruding portions 3041 and the positioning space 4042 of the protruding portions 4041, but it is noted that the present disclosure is not limited to the configurations of the positioning structures 304 and 404. For example, in other embodiments, each of the positioning structures could be a slot or another structure capable of fixing the wire.

Please refer to FIG. 6 to FIG. 9. FIGS. 6-9 are cross-sectional views showing an assembling method of the power connector in FIG. 1.

Figure 6:
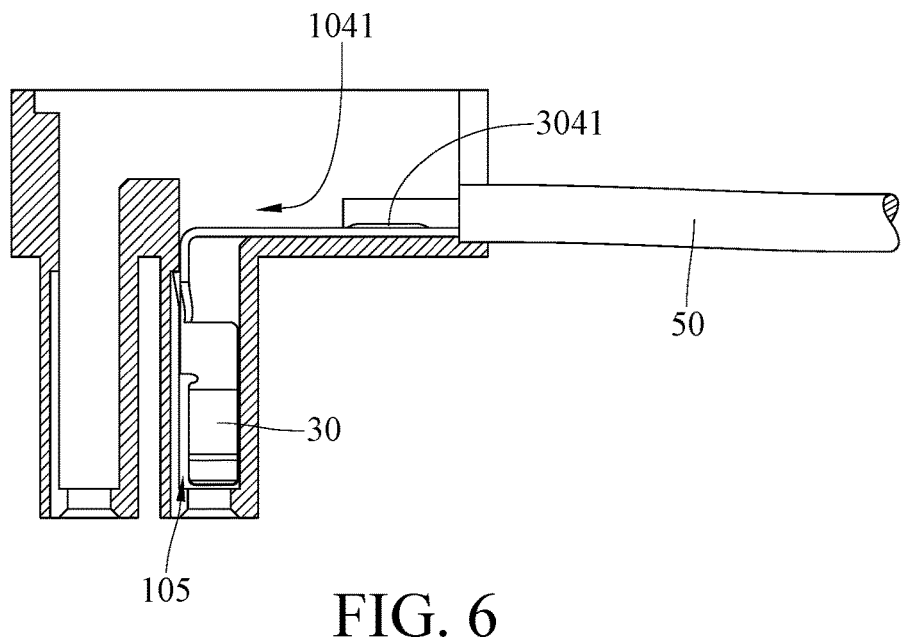
FIGS. 6-9 are cross-sectional views showing an assembling method of the power connector in FIG. 1.

Firstly, as shown in FIG. 6, the first pins 30 are respectively inserted into the first insertion slots 105 of the housing 10, and the first wires 50 are respectively inserted into the first wire channels 1041 of the housing 10, making the first wires 50 electrically connected with the first pins 30.

Figure 7:
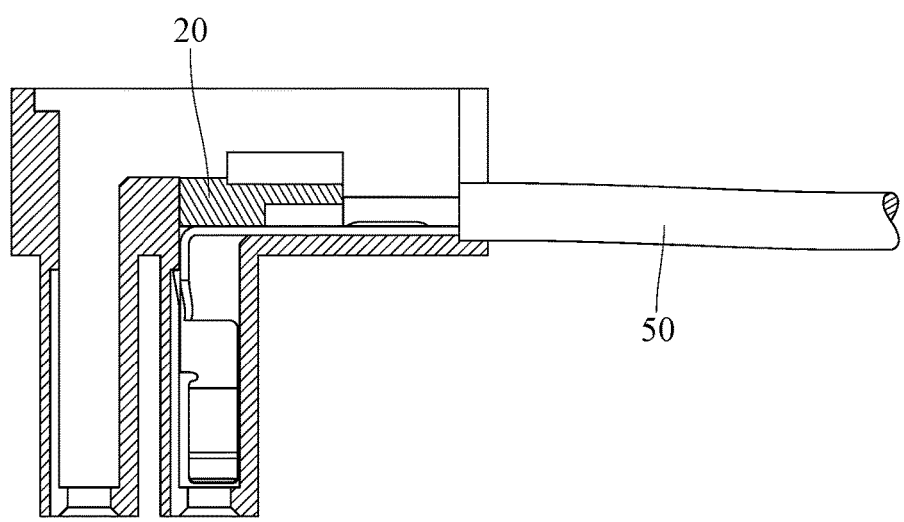

Then, as shown in FIG. 7, the partition plate 20 is disposed above the first wires 50.

Figure 8:
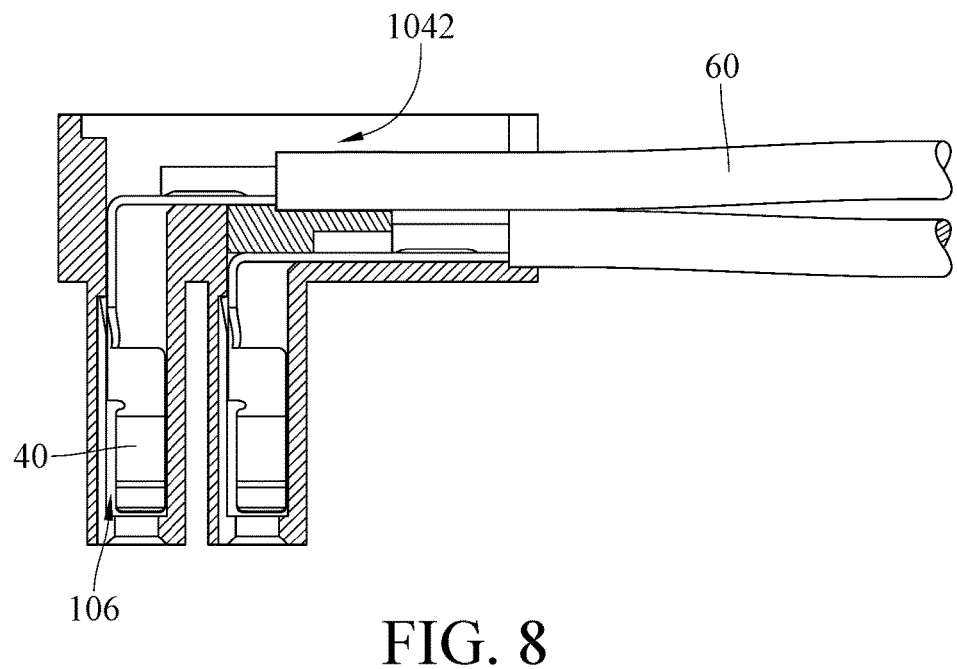

Then, as shown in FIG. 8, the second pins 40 are respectively inserted into the second insertion slots 106 of the housing 10, and the second wires 60 are respectively inserted into the second wire channels 1042 of the housing 10 and respectively positioned to align with the positioning slots 204 of the partition plate 20, making the second wires 60 respectively electrically connected to the second pins 40.

Figure 9:
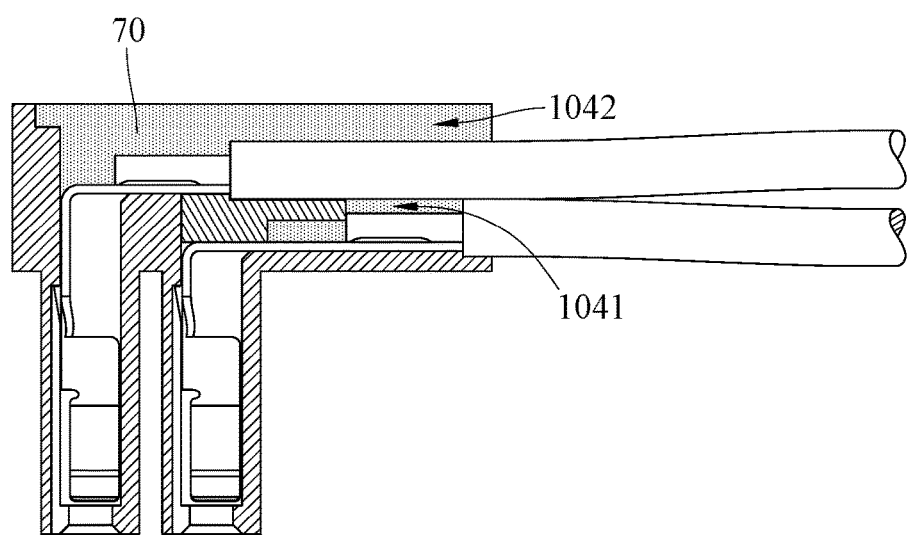

Lastly, as shown in FIG. 9, the filler 70 having a melting point lower than that of the housing 10 is filled into the first wire channels 1041 and the second wire channels 1042. When the filler 70 is solidified, the first wires 50 and the second wires 60 are enclosed in the housing 10 and separated from one another.

As discussed in the aforementioned method, the pins 30 and 40 and the wires 50 and 60 are placed into the housing 10, and then the housing 10 is filled with the filler 70, which is made of a different material from the housing 10 and has fluidity, to seal and separate the wires 50 and 60. By this manner, the pins 30 and 40 and the wires 50 and 60 can be placed without limitation of partition; that is, the pins 30 and 40 and the wires 50 and 60 have sufficient space to be disposed before adding the filler 70 to separate them, which is convenient for assembling.

In addition, the hardness of the housing 10 harder than that of the filler 70 allows the pins 30 and 40 and the wires 50 and 60 to be positioned in desired places before filling the filler 70, which is beneficial to ensure the assembling precision of the pins 30 and 40 and the wires 50 and 60, further improving the assembly quality.

It is noted that the order of assembling the power connector is not restricted to the above method. For example, in other embodiments, disposing the pins 30 and 40 may be placed before disposing the wires 50 and 60.

Figure 10:
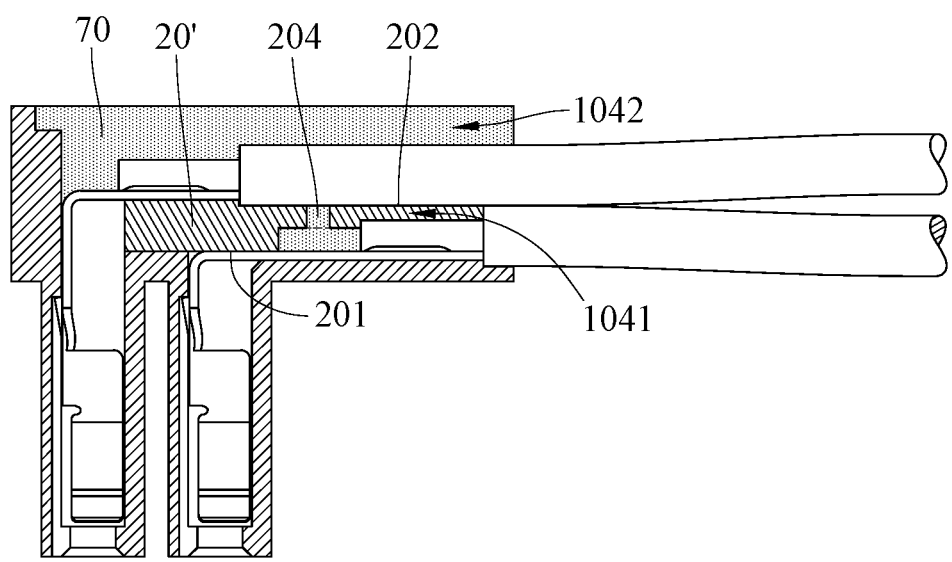
FIG. 10 is a cross-sectional view of a power connector in accordance with another embodiment of the disclosure.

Please refer to FIG. 10. FIG. 10 is a cross-sectional view of a power connector in accordance with another embodiment of the disclosure. In this embodiment, a partition plate 20' of a power connector 1b for separating the first wire channels 1041 and the second wire channels 1042 further has a filling hole 204. The filler 70 is able to be filled into the second wire channels 1042 through the filling hole 204.

According to the power connector and the assembling method thereof discussed above, the housing and the separator are made of different materials instead a single unit, the separator is the filler, which is made of a material different from that of the housing, to be filled into the housing for sealing and separating the pins and wires. That is, the filler is not preexisting in the housing but is filled into the housing after the pins and wires are positioned in desired positions. Therefore, there is no limitation while disposing the pins and wires, so the pins and wires have large space to be disposed, enabling convenient assembling.

In addition, the hardness of the housing harder than that of the filler allows the pins and wires to be positioned in desired places before filling the filler, which is beneficial to ensure the assembling precision of the pins and wires, further improving the assembly quality.

Furthermore, because the first insertion slots and the second insertion slots are perpendicular to the first wire channels and the second wire channels, and the inserting direction of the power connector is perpendicular to the extension direction of the wire, the length of the power connector in the inserting direction is short, thus it is beneficial for miniaturizing the computer devices, and the wires can be arranged along the surface of the electronic device so that airflow for heat dissipation is prevented from being blocked by the wires.

Moreover, because the contact ends of the first wires and the contact ends of the second wires are not aligned, so it can reduce the possibility of short-circuit when the contact end accidentally falls from the pin.

The embodiments were chosen and described in order to best explain the principles of the disclosure and its practical applications, to thereby enable others skilled in the art to best utilize the disclosure and various embodiments with various modifications as are suited to the particular use contemplated. It is intended that the scope of the disclosure be defined by the following claims and their equivalents.

What is claimed is:

1. A power connector, comprising:
   a housing, having an interior space, a plurality of first insertion slots and a plurality of second insertion slots, and the plurality of first insertion slots and the plurality of second insertion slots connected to the interior space;
   a partition plate, the partition plate located in the interior space and dividing the interior space into a plurality of first wire channels and a plurality of second wire channels, the plurality of first insertion slots perpendicular to the plurality of first wire channels, and the plurality of second insertion slots perpendicular to the plurality of second wire channels;
   a plurality of first pins and a plurality of second pins, each of the plurality of first pins and the plurality of second pins having an inserting section and a wire contact section, the inserting sections of the plurality of first pins respectively located in the plurality of first insertion slots, the inserting sections of the plurality of second pins respectively located in the plurality of second insertion slots, the wire contact sections of the plurality of first pins respectively located in the plurality of the first wire channels, and the wire contact sections of the plurality of second pins respectively located in the plurality of second wire channels;
   a plurality of first wires and a plurality of second wires, the plurality of first wires respectively located in the plurality of first wire channels and respectively electrically connected to the wire contact sections of the plurality of first pins, and the plurality of the second wires respectively located in the plurality of second wire channels and respectively electrically connected to the wire contact sections of the plurality of second pins; and
   a filler, made of a different material from the housing, and filled in the interior space in order to enclose and separate the plurality of first wires and the plurality of second wires.

2. The power connector according to claim 1, wherein the housing has a hardness that is larger than a hardness of the filler.

3. The power connector according to claim 1, wherein each of the wire contact sections of the plurality of first pins and the plurality of second pins has a positioning structure, the plurality of first wires are respectively disposed on the positioning structures of the plurality of first pins, and the plurality of second wires are respectively disposed on the positioning structures of the plurality of second pins.

4. The power connector according to claim 1, wherein the plurality of first pins and the plurality of second pins are made of high conductivity copper.

5. The power connector according to claim 1, wherein the housing further comprises a bottom portion, a surrounding portion and a plurality of protrusions, the surrounding portion connected to one side of the bottom portion, and the plurality of protrusions protrude from an opposite side of the bottom portion, the surrounding portion and the bottom portion together form the interior space, the plurality of first wire channels are located closer to the bottom portion than the plurality of second wire channels, the plurality of first insertion slots and the plurality of second insertion slots penetrate through the bottom portion and respectively penetrate through the plurality of protrusions, and each of the plurality of first insertion slots and the plurality of second insertion slots has an opening on an end away from the bottom portion.

6. The power connector according to claim 5, wherein the surrounding portion has a side wall and a plurality of through holes located on the side wall, each of the plurality of first wires and the plurality of second wires has a contact end, the plurality of first wires and the plurality of second wires are respectively disposed through the plurality of through holes, and the contact ends of the plurality of first wires are respectively connected to the wire contact sections of the plurality of first pins, the contact ends of the plurality of second wires are respectively connected to the wire contact sections of the plurality of second pins, distances between end surfaces of the contact ends of the plurality of first wires and the side wall are different from distances between end surfaces of the contact ends of the plurality of second wires and the side wall.

7. The power connector according to claim 5, wherein the partition plate has a first surface, a second surface and a plurality of positioning slots, the first surface faces the plurality of first wire channels, the second surface faces away from the first surface and faces the plurality of second wire channels, and the plurality of positioning slots are located on the second surface.

8. The power connector according to claim 7, wherein the partition plate further has at least one filling hole, the at least one filling hole penetrates through the partition plate so as to connect the plurality of first wire channels and the plurality of second wire channels.

9. The power connector according to claim 5, wherein each of the plurality of protrusions has an inner surface and a groove on the inner surface, some of the inner surfaces form the first insertion slots, and the rest of the inner surfaces form the second insertion slots, each of the inserting sections has two inserting pieces, which are opposite to each other and spaced apart by a heat dissipation channel, and the heat dissipation channels are respectively connected to the grooves.

10. The power connector according to claim 9, wherein in each of the plurality of protrusions, the groove has a stop surface facing the opening, each of the plurality of first pins and the plurality of second pins further has a middle section and an engaging portion, in each of the plurality of first pins and the plurality of second pins, the middle section is connected between the inserting pieces and the wire contact section, and the engaging portion is located at a junction between the middle section and the inserting pieces and presses against the stop surface, such that the plurality of first pins are respectively fixed in the plurality of the first insertion slots, and the plurality of second pins are respectively fixed in the plurality of the insertion slots.

11. An assembling method of a power connector, comprising:
    disposing a plurality of first pins into a plurality of first insertion slots of a housing, respectively;
    disposing a plurality of first wires into a plurality of first wire channels of the housing, respectively, and electrically connecting the plurality of first wires to the plurality of first pins, respectively;
    disposing a partition plate above the plurality of first wires;
    disposing a plurality of second pins into a plurality of second insertion slots of the housing, respectively;
    disposing a plurality of second wires into a plurality of second wire channels of the housing, respectively, and electrically connecting the plurality of second wires to the second pins, respectively; and
    enclosing the plurality of first wires and the plurality of second wires, comprising:
        filling a filler, which has a melting point lower than that of the housing, into the plurality of first wire channels and the plurality of second wire channels; and
        solidifying the filler so that the plurality of first wires and the plurality of second wires are enclosed in the housing.

12. The assembling method according to claim 11, wherein before respectively electrically connecting the plurality of second wires to the second pins, comprises respectively positioning the plurality of second wires to a plurality of positioning slots of the partition plate.

* * * * *